United States Patent
Godo

(10) Patent No.: US 8,138,063 B2
(45) Date of Patent: Mar. 20, 2012

(54) MANUFACTURING METHOD OF A SEMICONDUCTOR DEVICE INCLUDING A SINGLE CRYSTAL SEMICONDUCTOR FILM, AND A SEMICONDUCTOR FILM INCLUDING IMPURITY

(75) Inventor: Hiromichi Godo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 85 days.

(21) Appl. No.: 12/219,027

(22) Filed: Jul. 15, 2008

(65) Prior Publication Data

US 2009/0020815 A1    Jan. 22, 2009

(30) Foreign Application Priority Data

Jul. 19, 2007    (JP) ................. 2007-187970

(51) Int. Cl.
*H01L 21/30*        (2006.01)
(52) U.S. Cl. ........ 438/458; 438/406; 438/455; 438/480; 257/E21.212; 257/E21.563; 257/E21.564; 257/E21.567; 257/E21.568
(58) Field of Classification Search .................. 438/458, 438/406, 455, 480; 257/E21.212, E21.561, 257/E21.563, E21.564, E21.567, E21.568
See application file for complete search history.

(56) References Cited

U.S. PATENT DOCUMENTS

| | | | |
|---|---|---|---|
| 5,374,564 A | 12/1994 | Bruel | |
| 5,894,151 A | 4/1999 | Yamazaki et al. | |
| 6,127,702 A | 10/2000 | Yamazaki et al. | |
| 6,251,754 B1 * | 6/2001 | Ohshima et al. | 438/506 |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,908,797 B2 | 6/2005 | Takano | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,339,235 B1 | 3/2008 | Yamazaki et al. | |

(Continued)

FOREIGN PATENT DOCUMENTS

JP          05-326962        12/1993

(Continued)

*Primary Examiner* — Benjamin Sandvik
*Assistant Examiner* — Farid Khan
(74) *Attorney, Agent, or Firm* — Eric J. Robinson; Robinson Intellectual Property Law Office, P.C.

(57) ABSTRACT

An object of the present invention is to provide a semiconductor device having a structure which can realize not only suppressing a punch-through current but also reusing a silicon wafer which is used for bonding, in manufacturing a semiconductor device using an SOI technique, and a manufacturing method thereof. The semiconductor device can suppress the punch-through current by forming a semiconductor film in which an impurity imparting a conductivity type opposite to that of a source region and a drain region is implanted over a substrate having an insulating surface, and forming a channel formation region using a semiconductor film of stacked layers obtained by bonding a single crystal semiconductor film to the semiconductor film by an SOI technique.

21 Claims, 11 Drawing Sheets

U.S. PATENT DOCUMENTS

| | | |
|---|---|---|
| 2004/0104424 A1 | 6/2004 | Yamazaki |
| 2005/0009252 A1 | 1/2005 | Yamazaki et al. |
| 2005/0260800 A1 | 11/2005 | Takano |
| 2006/0292778 A1* | 12/2006 | Sekiguchi .................... 438/197 |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0281399 A1* | 12/2007 | Cites et al. .................... 438/149 |
| 2007/0291022 A1 | 12/2007 | Yamazaki et al. |
| 2008/0246109 A1 | 10/2008 | Ohnuma et al. |
| 2009/0162992 A1 | 6/2009 | Kato et al. |

FOREIGN PATENT DOCUMENTS

| | | |
|---|---|---|
| JP | 326962 | * 12/1993 |
| JP | 05326962 | * 12/1993 |
| JP | 07-142738 | 6/1995 |

\* cited by examiner

MANUFACTURING METHOD OF A SEMICONDUCTOR DEVICE INCLUDING A SINGLE CRYSTAL SEMICONDUCTOR FILM, AND A SEMICONDUCTOR FILM INCLUDING IMPURITY

BACKGROUND OF THE INVENTION

1. Field of the Invention

The present invention relates to a semiconductor device and a manufacturing method thereof. Specifically, the present invention relates to a technique for reducing a punch-through current in a thin film transistor (TFT) over a silicon on insulator (SOI) substrate formed using a bonding technique.

2. Description of the Related Art

In recent years, miniaturization of a semiconductor element such as a TFT has been developed with improvement in characteristics of an integrated circuit. However, various problems are caused by microfabrication in a submicron region.

As one problem, a phenomenon called a short-channel effect is typically known. The short-channel effect is a phenomenon, in a semiconductor element having a channel formation region between a source region and a drain region, caused because a charge in a channel formation region is largely affected not only by a gate voltage but also by a depletion layer charge, an electric field, and electrical potential distribution in a source region and a drain region, as the channel formation region is shortened.

In addition, as an effect on a semiconductor element by the short-channel effect, reduction in a threshold voltage (Vth) and a punch-through current are known.

By reducing the threshold voltage, power consumption can be reduced. However, since frequency characteristics do not generally become high by reducing a driving voltage of an integrated circuit, as a method for controlling the threshold voltage, a method for adding an impurity element imparting one conductivity type into the entire channel formation region to control the threshold voltage by the added amount of the impurity element, is employed. However, along with this, there are problems that a punch-through current is generated and carriers are scattered by the added impurity to reduce mobility of the carriers.

Furthermore, it is known that when the effect of a gate voltage to a drain current is reduced due to the punch-through current, subthreshold characteristics become worse and switching characteristics of a semiconductor element is deteriorated. As a method for suppressing the punch-through current, there is a method in which a channel formation region is formed to be thin; however, such a problem occurs that when the channel formation region is formed to be thin, resistance of a source region and a drain region is increased and an ON current of the semiconductor element is decreased.

As another method for suppressing the punch-through current, there is a method in which an impurity element imparting a conductivity type opposite to that of a source region and a drain region is implanted into a bottom portion of the channel formation region; however, it is difficult to implant the impurity element only into the bottom portion of the channel formation region from the surface of the channel formation region.

On the other hand, a method is known in which after an impurity element imparting a conductivity type opposite to that of a source region and a drain region is implanted into a silicon substrate using an SOI technique, the silicon substrate is bonded to a base substrate and polished, thereby forming an impurity implanted region for suppressing a punch-through current in a bottom portion of a channel formation region of a semiconductor element formed over the base substrate (For example, see patent document 1: Published Patent Application No. H5-326962 and patent document 2: Published Patent Application No. H7-142738).

However, in the case of applying such a method, since the impurity element is implanted into the silicon substrate, after the silicon substrate is bonded to the base substrate, the silicon substrate which is separated from the base substrate cannot be reused efficiently, and there is a problem of saving resources.

SUMMARY OF THE INVENTION

It is an object of the present invention to provide a semiconductor device having a structure which can realize not only suppressing a punch-through current but also reusing a silicon wafer which is used for bonding, in manufacturing a semiconductor device using an SOI technique, and a manufacturing method thereof.

The semiconductor device of the present invention can suppress the punch-through current by forming a semiconductor film into which an impurity imparting a conductivity type opposite to that of a source region and a drain region is implanted over a substrate having an insulating surface, and forming a channel formation region using a semiconductor film of stacked layers obtained by bonding a single crystal semiconductor film by an SOI technique.

According to one of the present invention, a semiconductor device includes a substrate having an insulating surface, a first semiconductor film formed over the substrate, and a second semiconductor film bonded to the first semiconductor film. The second semiconductor film is a single crystal semiconductor. A source region and a drain region are formed in the first semiconductor film and the second semiconductor film. A channel formation region formed in a portion of the second semiconductor film between the source region and the drain region. The source region and the drain region include a first conductivity type impurity. A part of the first semiconductor film under the channel formation region includes a second conductivity type impurity of which conductivity type is opposite to a conductivity type of the first conductivity type impurity.

According to one of the present invention, a semiconductor device includes a substrate having an insulating surface, a first semiconductor film formed over the substrate, and a second semiconductor film including a single crystal semiconductor bonded to the first semiconductor film, a gate electrode formed over the second semiconductor film, sidewall insulating layers formed on either side of the gate electrode. A source region and a drain region are formed in the first semiconductor film and the second semiconductor film. A channel formation region is formed in a portion of the second semiconductor film between the source region and the drain region. The source region and the drain region include a first conductivity type impurity. A part of the first semiconductor film under the channel formation region includes a second conductivity type impurity of which conductivity type is opposite to a conductivity type of the first conductivity type impurity. First and second lightly doped regions are formed under the sidewall insulating layers in the first semiconductor film and the second semiconductor film. The first lightly doped region is formed between the source region and the channel formation region. The second lightly doped region is formed between the drain region and the channel formation region.

Further, in the above structure, the part of the first semiconductor film under the channel formation region includes the second conductivity type impurity at a concentration of from $5\times10^{15}$ atoms/cm$^3$ to $5\times10^{17}$ atoms/cm$^3$.

According to one of the present invention, a method for manufacturing a semiconductor device is described below. A first semiconductor film is formed over a substrate having an insulating surface. Here, the first semiconductor film includes a first conductivity type impurity. An ion separation layer is formed in a region of a predetermined depth below a surface of a single crystal semiconductor substrate by irradiating the single crystal semiconductor substrate with at least one kind of ions generated by plasma excitation of a source gas selected from the group consisting of hydrogen, helium, and halogen. Here, the ions are constituted by the same element. The surface of the single crystal semiconductor substrate is bonded to the surface of the first semiconductor film. A crack is generated in the ion separation layer by heating the bonded single crystal semiconductor substrate and the first semiconductor film. A second semiconductor film is formed by separating the single crystal semiconductor substrate at the crack in the ion separation layer with the second semiconductor film left on the first semiconductor film.

According to one of the present invention, a method for manufacturing a semiconductor device is described below. A first semiconductor film is formed over a substrate having an insulating surface. Here, an insulating film may be formed between the substrate and the first semiconductor film. A first conductivity type impurity is implanted into a first portion of the first semiconductor film. A second conductivity type impurity is implanted into a second portion of the first semiconductor film. Here, the second conductivity type impurity is opposite to a conductivity type of the first conductivity type impurity. An ion separation layer is formed in a region of a predetermined depth below a surface of a single crystal semiconductor substrate by irradiating the single crystal semiconductor substrate with at least one kind of ions generated by plasma excitation of a source gas selected from the group consisting of hydrogen, helium, and halogen. Here, the ions are constituted by the same element. The surface of the single crystal semiconductor substrate is bonded to the surface of the first portion and the second portion of the first semiconductor film. A crack is generated in the ion separation layer by heating the bonded single crystal semiconductor substrate and the first portion and the second portion of the first semiconductor film. A second semiconductor film is formed by separating the single crystal semiconductor substrate at the crack in the ion separation layer with the second semiconductor film left on the first portion and the second portion of the first semiconductor film.

Note that in the above method, the heating may be performed at a temperature at which the ions contained in the ion separation layer are released from the ion separation layer. Furthermore, the heating may be performed at from 400° C. to 600° C.

According to the present invention, by forming an impurity region imparting a conductivity type opposite to that of a source region and a drain region in a bottom portion of a channel formation region, a punch-through current can be suppressed, thereby manufacturing a semiconductor device with high switching characteristics and high reliability. Note that the semiconductor device manufactured by the present invention is formed by an SOI technique, however; a silicon wafer used for bonding is not contaminated with an impurity in manufacturing the semiconductor device. Therefore, the silicon wafer can be reused in manufacturing another semiconductor device.

DETAILED DESCRIPTION OF THE INVENTION

Embodiment Mode

Embodiment Modes of the present invention are described hereinafter with reference to the drawings. However, the present invention is not limited to description to be given below, and the present invention can be embodied in a wide variety of different ways, and therefore, various modifications and variations can be made to the present invention without departing from the spirit and scope thereof. Thus, the present invention should not be construed as being limited to the description in the following embodiment modes.

Embodiment Mode 1

In Embodiment Mode 1, a manufacturing method of a semiconductor device according to the present invention is described with reference to FIGS. 1A to 1C and FIGS. 2A to 2D.

Figure 1A:
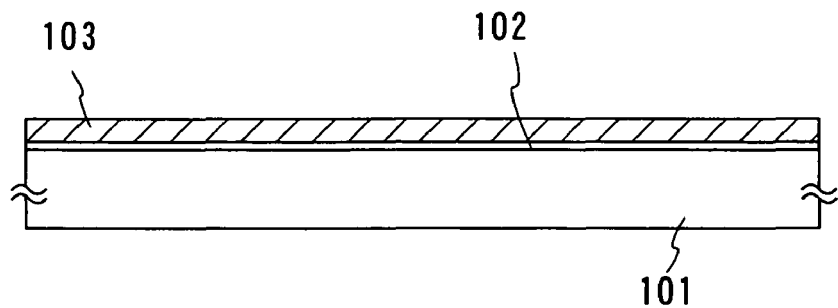
FIGS. 1A to 1C are cross-sectional views illustrating a method for manufacturing a semiconductor device of the present invention.

In FIG. 1A, a substrate 101 is a substrate having an insulating surface or an insulating substrate, and any of a variety of glass substrates that are used in the electronics industry, such as an aluminosilicate glass substrate, an aluminoborosilicate glass substrate, and a barium borosilicate glass substrate, can be used. Alternatively, a quartz glass substrate or a semiconductor substrate such as a silicon wafer can be also used.

Further, an insulating film 102 functioning as a base film is formed over the substrate 101. The insulating film 102 is not necessarily provided, however, it is effective in preventing diffusion and contamination by an impurity such as alkali metal or the like from the substrate 101 into a first semiconductor film 103 that is to be formed over the substrate 101 in a later step.

The insulating film 102 is formed of an insulating material such as silicon oxide, silicon nitride, silicon containing oxygen and nitrogen (oxynitride silicon), or the like, using a CVD method, a sputtering method, or the like. When the insulating film 102 has a two-layer structure, for example, it is preferable to form a silicon nitride layer as a first-layer insulating film, and to form a silicon oxynitride layer as a second-layer insulating film. Alternatively, a silicon nitride layer may be formed as the first-layer insulating film, and a silicon oxide layer may be formed as the second-layer insulating film.

The first semiconductor film 103 is formed over the insulating film 102. A single crystal semiconductor or a polycrystalline semiconductor can be used as the first semiconductor film 103. Here, a polycrystalline semiconductor obtained by irradiating an amorphous semiconductor with a laser is used. Note that the semiconductor film can be formed by a sputtering method, a plasma CVD method, a low-pressure CVD method, or the like. As a semiconductor material, silicon or silicon germanium can be used. As a crystallization method of the semiconductor film, in addition to the above described laser crystallization method, a crystallization method by heat treatment using rapid thermal annealing (RTA) or an annealing furnace, a crystallization method using a metal element which promotes crystallization, or a method in which the above methods are combined can be employed.

The thickness of the first semiconductor film 103 is set to be from 5 nm to 500 nm, preferably from 10 nm to 200 nm, and more preferably from 10 nm to 60 nm.

Figure 1B:
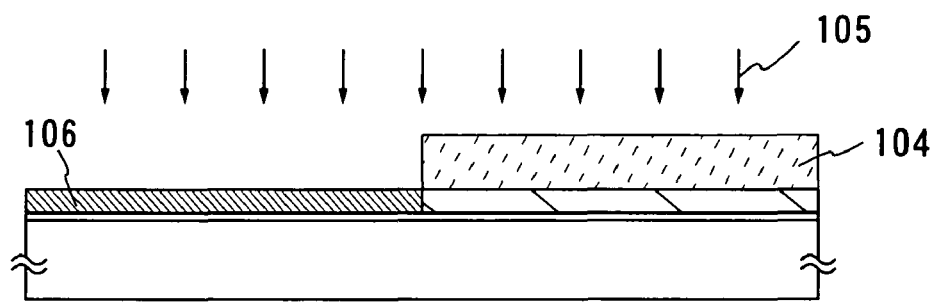

Then, an impurity is implanted into the first semiconductor film 103. First, after a part of the first semiconductor film 103 is covered with a resist 104, a p-type impurity 105 is implanted into the first semiconductor film 103. As the p-type impurity 105, for example, boron, aluminum, gallium, or the like can be used, and may be added at a concentration of approximately from $5 \times 10^{15}$ atoms/cm$^3$ to $5 \times 10^{17}$ atoms/cm$^3$. Accordingly, as shown in FIG. 1B, a first semiconductor film 106 in which the p-type impurity 105 is implanted into a region in the first semiconductor film 103 which is not covered with the resist 104 can be formed.

Figure 1C:
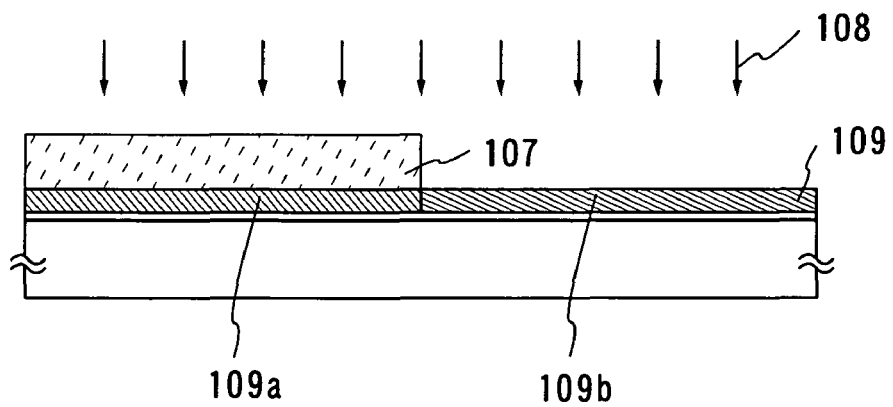

Subsequently, the resist 104 is removed, and another resist 107 is former over a region where the p-type impurity 105 is implanted, and an n-type impurity 108 is implanted into the first semiconductor film 106. As the n-type impurity 108, for example, phosphorus, arsenic, or the like can be used, and may be added at a concentration of approximately from $5 \times 10^{15}$ atoms/cm$^3$ to $1 \times 10^{16}$ atoms/cm$^3$. Accordingly, as shown in FIG. 1C, a first semiconductor film 109 in which the n-type impurity 108 is implanted into a region in the first semiconductor film 106 which is not covered with the resist 107 can be formed. At this time, the resist 107 is removed.

Note that by forming a bottom portion of a channel formation region of a transistor using the resulting first semiconductor film 109, a punch-through current which flows through the bottom portion of the channel formation region can be suppressed. The region in the first semiconductor film 109 where the p-type impurity is implanted (a first semiconductor film 109a) forms a bottom portion of a channel formation region of the n-channel TFT, and the region in the first semiconductor film 109 where the n-type impurity is implanted (a first semiconductor film 109b) forms a bottom portion of a channel formation region of the p-channel TFT. Note that the channel formation regions are each formed in a region which overlaps with a gate electrode and interposed between a source region and a drain region.

Subsequently, a second semiconductor film formed of an SOI (silicon on insulator) layer that is formed by separation technique is formed over the first semiconductor film 109.

Here, description is made of the case where the second semiconductor film is formed of silicon that can be separated from the single crystal semiconductor substrate, however; a crystalline semiconductor layer formed of silicon, germanium, or a compound semiconductor such as gallium arsenide or indium phosphide, which can be separated from a single crystal semiconductor substrate or a polycrystalline semiconductor can also be used.

Figure 2A:
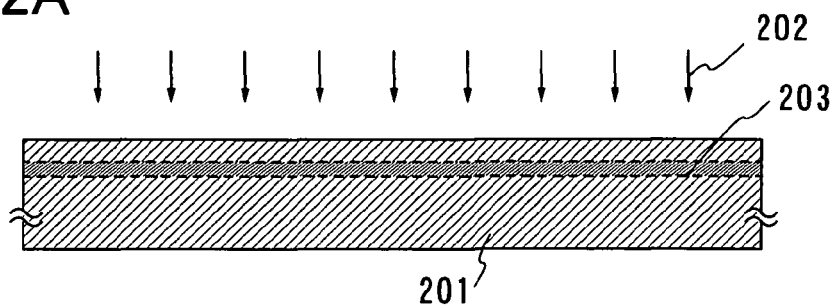
FIGS. 2A to 2D are cross-sectional views illustrating a method for manufacturing a semiconductor device of the present invention.

A surface of a semiconductor substrate 201 is cleaned as shown in FIG. 2A, and ions 202 which are accelerated by an electric field are implanted into a predetermined depth from the surface of the semiconductor substrate 201, thereby forming a ion separation layer 203. The ions 202 are implanted in consideration of the thickness of the second semiconductor film which is to be transferred to the substrate 101. The thickness of the second semiconductor layer is from 5 nm to 500 nm, preferably from 10 nm to 200 nm. Accelerating voltage for implanting the ions into the semiconductor substrate 201 is set in consideration of such a thickness.

The ion separation layer 203 is formed by implanting ions of hydrogen, helium, or halogen typified by fluorine. Note that a method for implanting ions for forming the ion separation layer 203 includes a so-called ion doping method, and an ion implantation method. In this case, it is preferable to implant one kind of ions or plural kinds of ions with different masses of the same atom. In the case of implanting hydrogen ions, the hydrogen ions preferably include $H^+$, $H_2^+$, and $H_3^+$ ions with a high proportion of $H_3^+$ ions. With a high proportion of $H_3^+$ ions, implantation efficiency can be increased and implantation time can be shortened. With such a structure, separation can be easily performed.

Figure 2B:
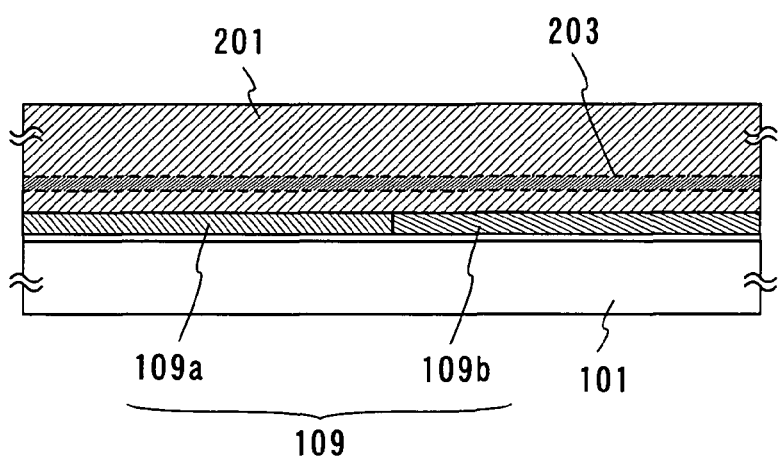

FIG. 2B shows a mode in which the first semiconductor film 109 formed over the substrate 101 and the semiconductor substrate 201 are disposed in contact to be bonded to each other. The surfaces which are to be bonded are cleaned sufficiently. Then, the first semiconductor film 109 over the substrate 101 and the semiconductor substrate 201 are disposed in contact with each other, whereby a bond is formed therebetween. This bond is formed by Van der Waals forces. When the surfaces of the substrate 101 and the semiconductor substrate 201 are pressed against each other, a stronger bond can be formed by hydrogen bonding.

After the substrate 101 and the semiconductor substrate 201 are bonded to each other, heat treatment or pressure treatment is preferably performed. When the heat treatment or pressure treatment is performed, bonding strength can be increased. Temperature of the heat treatment is preferably lower than or equal to the upper temperature limit of the substrate 101. The pressure treatment is performed so that the pressure is applied in a perpendicular direction to the bonded surfaces, in consideration of pressure resistance of the substrate 101 and the semiconductor substrate 201.

Figure 2C:
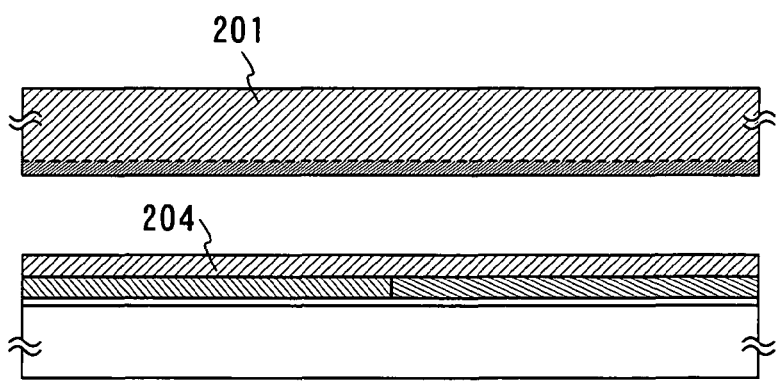

After the substrate 101 and the semiconductor substrate 201 are bonded to each other, heat treatment is performed as shown in FIG. 2C to separate the semiconductor substrate 201 from the substrate 101 with the ion separation layer 203 as a cleavage plane. The heat treatment is preferably performed at from 400° C. to the upper temperature limit of the substrate 101. When the heat treatment is performed at, for example, from 400° C. to 600° C., the volume of microvoids formed in the ion separation layer 203 is changed, so that cleavage can be performed along the ion separation layer 203. Since a second semiconductor film 204 that is a part of the semiconductor substrate 201 is bonded to the first semiconductor film 109 over the substrate 101, the semiconductor film 204 having the same crystallinity as the semiconductor substrate 201 is formed over the first semiconductor film 109 (109a and 109b).

The semiconductor substrate 201 which is separated from the substrate 101 here can be reused after the separation surface of the semiconductor substrate 201 is planarized and cleaned. Specifically, planarization can be performed by chemical mechanical polishing (CMP)

Figure 2D:
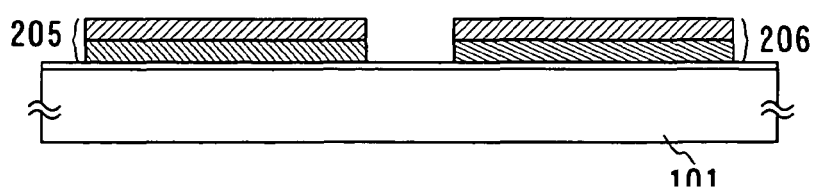
Figure 3A:
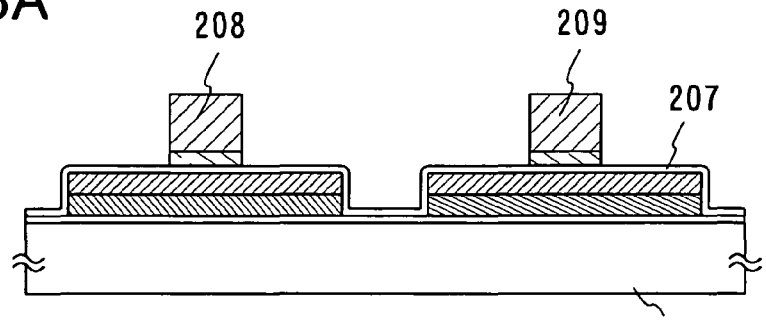
FIGS. 3A to 3D are cross-sectional views illustrating a method for manufacturing a semiconductor device of the present invention.

The first semiconductor film 109 (109a and 109b), and the second semiconductor film 204 are etched to form stacked semiconductor films 205 and 206 which are separated in island shapes in accordance with arrangement of semiconductor elements (see FIG. 2D). Then, as shown in FIG. 3A, a gate insulating film 207 is formed. The gate insulating film 207 is formed with a thickness of from 5 nm to 50 nm. The gate insulating film 207 is preferably formed of a silicon oxide film or a silicon oxynitride film.

Here, the gate insulating film 207 is formed by a vapor deposition method. In the case of forming the gate insulating film 207 with high quality at a temperature of 450° C. or lower, a plasma CVD method is preferably used. In particular, it is preferable to use a microwave plasma CVD method with an electron density approximately from $1 \times 10^{11}$ cm$^{-3}$ to $1 \times 10^{13}$ cm$^{-3}$ and an electron temperature approximately from 0.2 eV to 2.0 eV (preferably, from 0.5 eV to 1.5 eV). When plasma with high electron density, a low electron temperature, and low kinetic energy of active species is used, a film which has little plasma damage and few defects can be formed.

After forming the gate insulating film 207, gate electrodes 208 and 209 are formed (FIG. 3A). As the material used to form the gate electrodes 208 and 209, for example, a metal element such as Ag, Au, Cu, Ni, Pt, Pd, Ir, Rh, W, Al, Ta, Mo, Cd, Zn, Fe, Ti, Si, Ge, Zr, Ba, or Nd, an alloy material containing the metal element as its main component, a compound material such as metal nitride containing the metal element, or a material using a plurality thereof can be used.

Figure 3B:
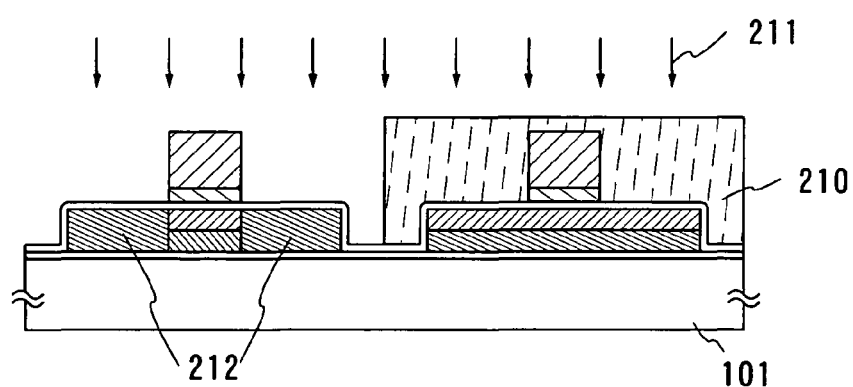
Figure 3C:
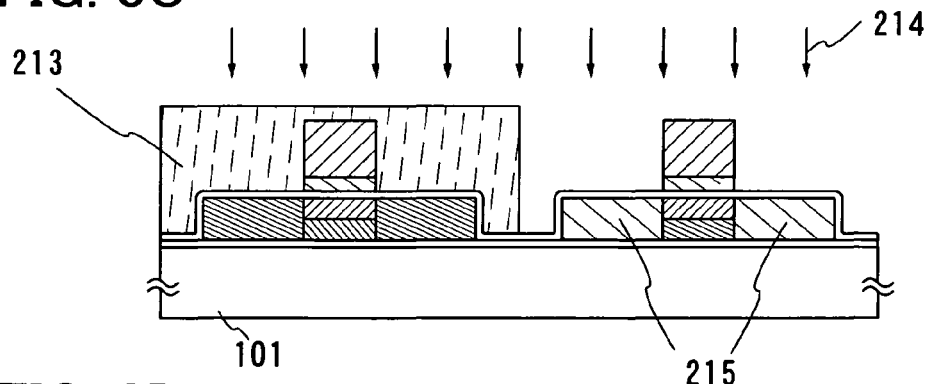

Then, a resist 210 is formed and an n-type impurity 211 is implanted, thereby forming first impurity regions 212 (see FIG. 3B). Further, after the resist 210 is removed, a resist 213 is formed and a p-type impurity 214 is implanted, thereby forming second impurity regions 215 (see FIG. 3C). Thereafter, the resist 213 is removed.

The first impurity regions 212 formed here each function as a source region or a drain region of an n-channel transistor. The first impurity regions 212 are formed by addition of phosphorus or arsenic, which is the n-type impurity 211, at a peak concentration of approximately from $1 \times 10^{18}$ atoms/cm$^3$ to $1 \times 10^{20}$ atoms/cm$^3$. Further, the second impurity regions 215 each function as a source region or a drain region of a p-channel transistor. The second impurity regions 215 are formed by addition of boron, aluminum, gallium, or the like, which is the p-type impurity 214, at a peak concentration of approximately from $1 \times 10^{18}$ atoms/cm$^3$ to $1 \times 10^{20}$ atoms/cm$^3$.

Figure 3D:
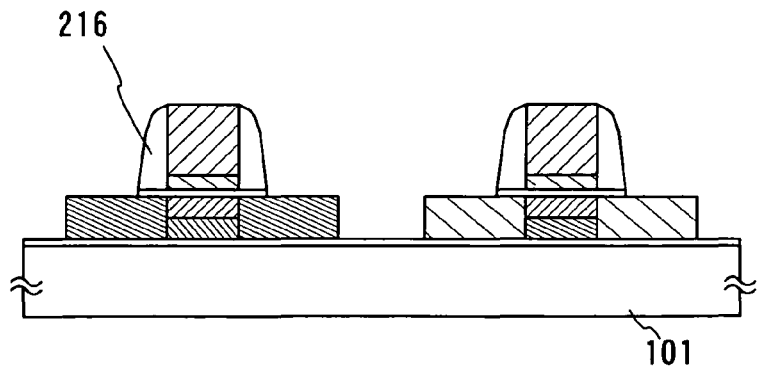
Figure 4A:
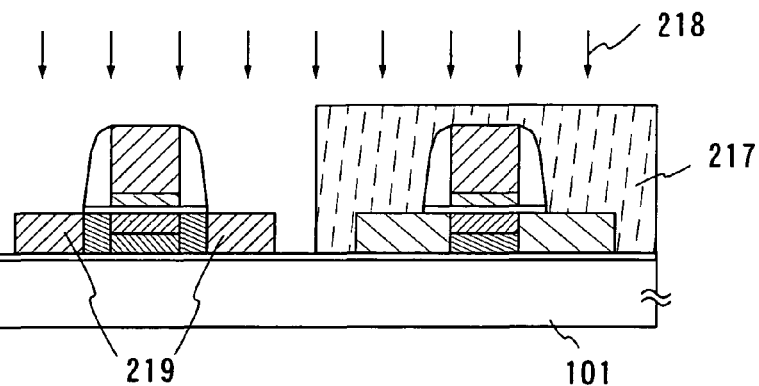
FIGS. 4A to 4D are cross-sectional views illustrating a method for manufacturing a semiconductor device of the present invention.
Figure 4B:
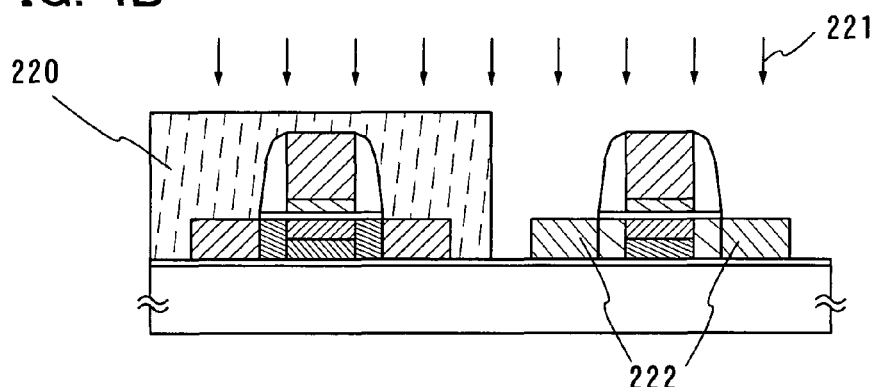

Then, sidewall insulating layers 216 are formed (FIG. 3D). A resist 217 is formed and an n-type impurity 218 is implanted, thereby forming third impurity regions 219 (see FIG. 4A). The third impurity regions 219 are formed by addition of phosphorus or arsenic, which is the n-type impurity 218, at a peak concentration of approximately from $1 \times 10^{19}$ atoms/cm$^3$ to $1 \times 10^{20}$ atoms/cm$^3$. After the resist 217 is removed, a resist 220 is formed and a p-type impurity 221 is implanted, thereby forming fourth impurity regions 222 (see FIG. 4B). Consequently, lightly doped regions are formed under sidewall insulating layers. The fourth impurity regions 222 can be formed by addition of boron, aluminum, gallium, or the like, which is the p-type impurity 221, at a peak concentration of approximately from $1 \times 10^{19}$ atoms/cm$^3$ to $5 \times 10^{21}$ atoms/cm$^3$.

Figure 4C:
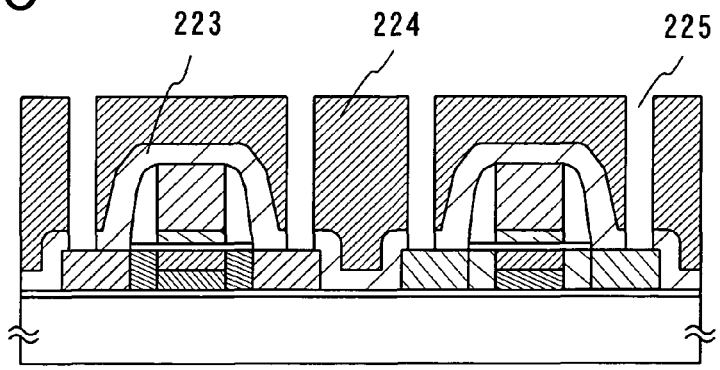

After the resist 220 is removed, a protective film 223 is formed. As the protective film 223, a silicon nitride film or a silicon nitride oxide film can be used. An interlayer insulating film 224 is formed over the protective film 223. As the interlayer insulating film 224, in addition to an inorganic insulating film such as silicon oxide, silicon nitride, silicon oxynitride, or silicon nitride oxide, a boron phosphorus silicon glass (BPSG) film, or an organic resin film typified by polyimide can be used. Furthermore, contact holes 225 are formed in the protective film 223 and the interlayer insulating film 224 (see FIG. 4C).

Figure 4D:
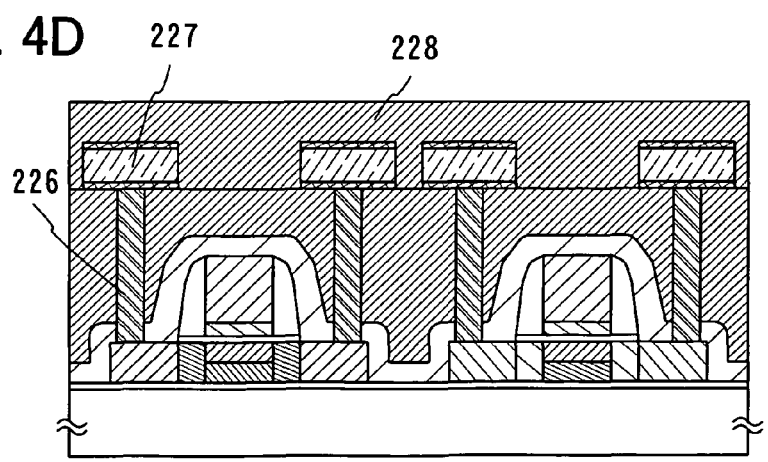

Then, formation of a wiring is described. In the contact holes 225, contact plugs 226 are formed as shown in FIG. 4D. As the contact plugs 226, tungsten silicide is formed by a chemical vapor deposition method using a WF$_6$ gas and a SiH$_4$ gas to fill the contact holes 225. Alternatively, tungsten may be formed by hydrogen reduction of a WF$_6$ gas to fill the contact holes 225. After that, wirings 227 are formed to correspond to the contact plugs 226. The wirings 227 are formed of aluminum or an aluminum alloy, and an upper layer and a lower layer thereof are formed using metal films of molybdenum, chromium, titanium, or the like as barrier metal. Furthermore, an interlayer insulating layer 228 is formed thereover. The wirings 227 may be provided as appropriate, and a multilayer wiring may be formed by further forming a wiring layer over the wirings 227. In the case of forming the multilayer wiring, a damascene process may be employed.

Figure 5:
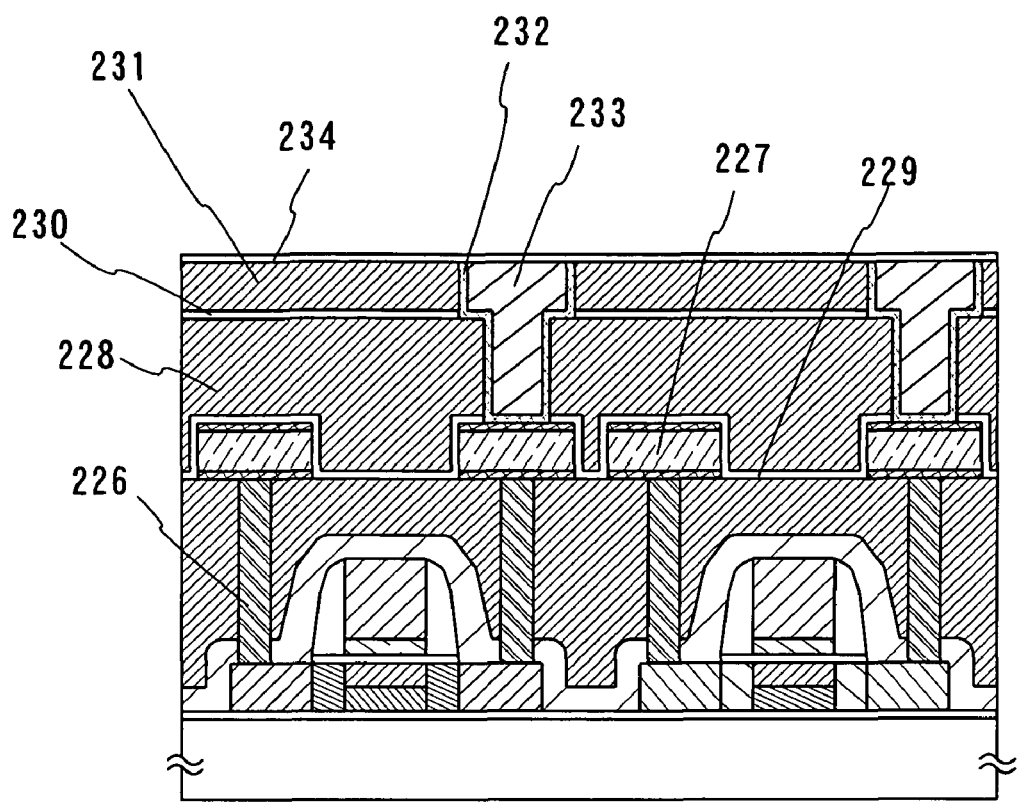
FIG. 5 is a cross-sectional view illustrating a method for manufacturing a semiconductor device of the present invention.

FIG. 5 shows a mode of forming a multilayer wiring by further forming an upper layer of wiring over the interlayer insulating layer 228. A passivation film 229 is formed of a silicon nitride film over the wirings 227, and the interlayer insulating layer 228 is provided. Further, a passivation film 230 and an insulating layer 231 between wirings are formed. The wiring thus formed as the upper layer can be formed by, for example, a damascene method or a dual-damascene method. A barrier metal 232 is formed of tantalum or tantalum nitride. A copper wiring 233 is formed by a plating method and embedded in the insulating layer 231 between wirings by a chemical mechanical polishing (CMP) method. A passivation film 234 is formed of silicon nitride thereover. The number of layers stacked as wirings is optional and may be selected as appropriate.

Accordingly, a thin film transistor can be manufactured using an SOI substrate in which a first semiconductor film added with an impurity and a second semiconductor film that is a single crystal semiconductor film formed by bonding are stacked.

In the thin film transistor of this embodiment mode, a channel formation region is formed of a semiconductor film in which the first semiconductor film and the second semiconductor film are stacked. By implanting an impurity (an n-type impurity or a p-type impurity) having one conductivity type opposite to that of the source and the drain regions to the first semiconductor film 103 which is provided for the back channel side (the side opposite to the gate electrode 208) of the channel formation region, a punch-through current which flows through the bottom portion of the channel formation region of a transistor can be suppressed. Therefore, a transistor with sharp subthreshold characteristics and excellent switching characteristics can be obtained. The second semiconductor film 204 formed by an SOI technique is a single crystal semiconductor that has uniform crystal orientation; therefore, it is possible to suppress inhomogeneity of values of important transistor characteristics, such as a threshold voltage and mobility, and to achieve high performance such as high mobility.

Moreover, in this embodiment mode, because the semiconductor substrate used for bonding is separated without being added with an impurity and the like, by performing surface polishing and cleaning of a separation surface, the semiconductor substrate can be reused.

Embodiment Mode 2

Figure 6:
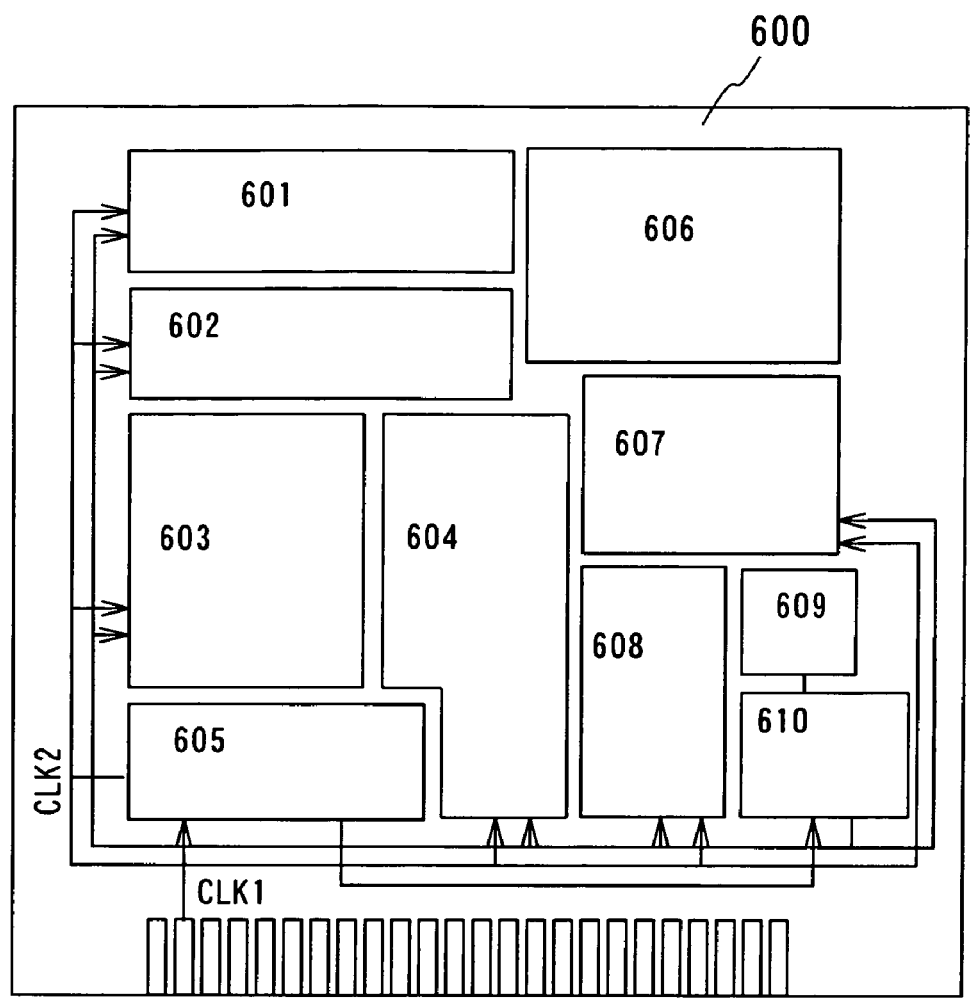
FIG. 6 is a block diagram illustrating a structure of a microprocessor of the present invention.

In Embodiment Mode 2, as an example of a semiconductor device formed by the present invention as shown in Embodiment Mode 1, a microprocessor 600 is described with reference to FIG. 6.

The microprocessor includes an arithmetic logic unit (also referred to as ALU) 601, an ALU controller 602, an instruction decoder 603, an interrupt controller 604, a timing controller 605, a register 606, a register controller 607, a bus interface (Bus I/F) 608, a read only memory (ROM) 609, and a memory interface (ROM I/F) 610.

An instruction inputted to the microprocessor through the bus interface 608 is inputted to the instruction decoder 603 and decoded. Then, the instruction is inputted to the ALU controller 602, the interrupt controller 604, the register controller 607, and the timing controller 605. The ALU controller 602, the interrupt controller 604, the register controller 607, and the timing controller 605 perform various controls based on the decoded instruction.

Specifically, the ALU controller 602 generates a signal for controlling the operation of the arithmetic logic unit 601. The interrupt controller 604 determines an interrupt request from an external input/output device or a peripheral circuit based on its priority or a mask state, and processes the request while a program of the microprocessor is executed. The register controller 607 generates an address of the register 606, and reads/writes data from/to the register 606 in accordance with the state of the microprocessor. The timing controller 605 generates signals for controlling timing of operation of the arithmetic logic unit 601, the ALU controller 602, the instruction decoder 603, the interrupt controller 604, and the register controller 607. For example, the timing controller 605 is provided with an internal clock generator for generating an internal clock signal CLK2 based on a reference clock signal CLK1, and supplies the clock signal CLK2 to each of the above-mentioned circuits. It is to be noted that the microprocessor illustrated in FIG. 6 is just an example of the simplified structure, and practical microprocessors have various structures depending on usage.

In a semiconductor element included in such a microprocessor, a channel formation region is formed of a semiconductor film in which a first semiconductor film and a second semiconductor film are stacked. By implanting an impurity (an n-type impurity or a p-type impurity) having a conductivity type opposite to that of the source and the drain regions to the first semiconductor film which is provided for the back channel side (the side opposite to the gate electrode) of the channel formation region, a punch-through current which flows through the bottom portion of the channel formation region of a transistor can be suppressed. Therefore, switching characteristics can be improved. Furthermore, the second semiconductor film formed by an SOI technique is a single crystal semiconductor that has uniform crystal orientation; therefore, it is possible to suppress inhomogeneity of values of transistor characteristics, such as threshold voltage and mobility, and to achieve high performance such as high mobility.

The structure shown in Embodiment Mode 2 can be freely combined with the structure shown in Embodiment Mode 1.

Embodiment Mode 3

[RFCPU]

Figure 7:
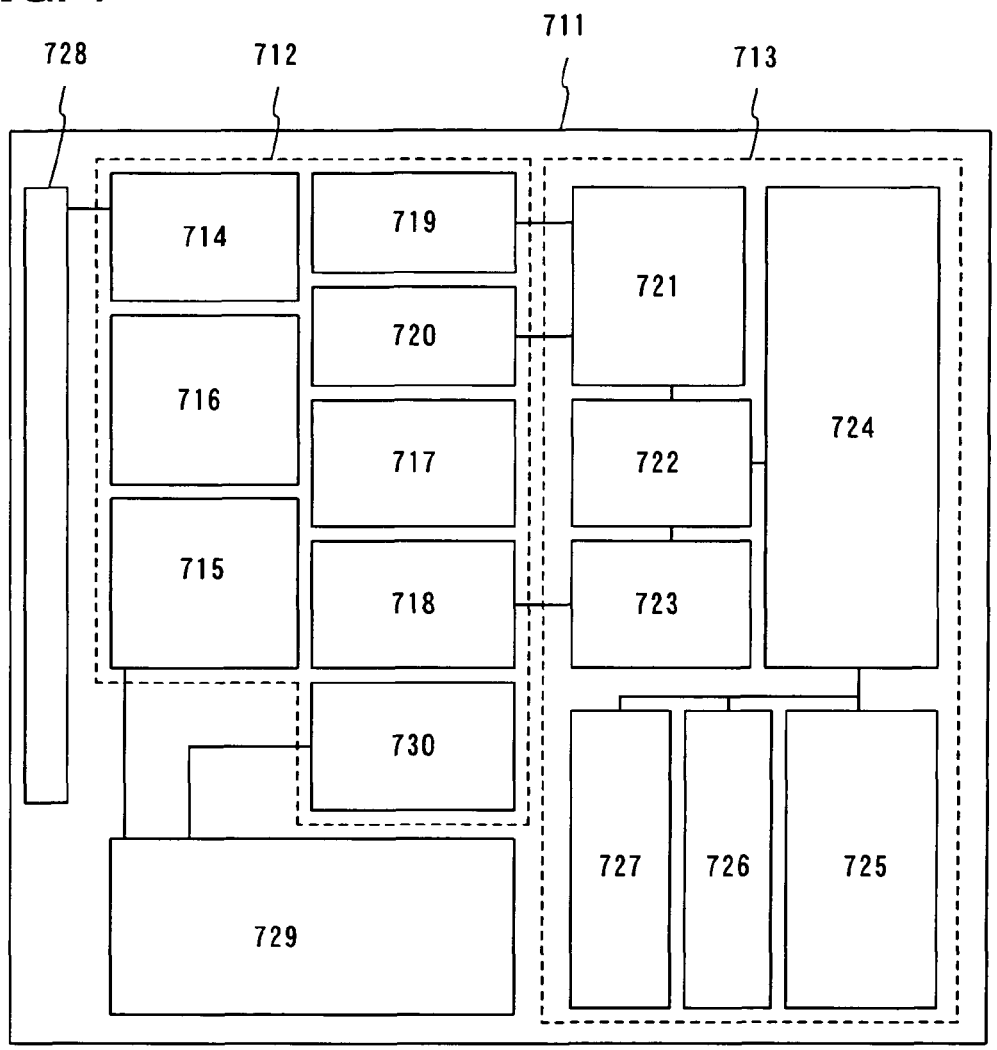
FIG. 7 is a block diagram illustrating a structure of an RFCPU in the present invention.

In Embodiment Mode 3, as an example of a semiconductor device formed according to the present invention as shown in Embodiment Mode 1, a semiconductor device having an arithmetic function, which is capable of transmitting and receiving data without contact, is described FIG. 7 is an example of a computer (hereinafter referred to as an RFCPU) which operates by transmitting and receiving signal to/from an external device by wireless communication. An RFCPU 711 has an analog circuit portion 712 and a digital circuit portion 713. The analog circuit portion 712 includes a resonant circuit 714 having a resonant capacitor, a rectifier circuit 715, a constant voltage circuit 716, a reset circuit 717, an oscillator circuit 718, a demodulation circuit 719, a modulation circuit 720, and a power supply control circuit 730. The digital circuit portion 713 includes an RF interface 721, a control register 722, a clock controller 723, a CPU interface 724, a central processing unit (CPU) 725, a random access memory (RAM) 726, and a read only memory (ROM) 727.

The operation of the RFCPU 711 having such a structure is described below. A signal received at an antenna 728 causes induced electromotive force at the resonant circuit 714. The induced electromotive force is stored in a capacitor portion 729 via the rectifier circuit 715. The capacitor portion 729 is preferably formed using a capacitor such as a ceramic capacitor or an electric double layer capacitor. The capacitor portion 729 may be formed over the same substrate as the RFCPU 711 or may be attached as another component to a substrate having an insulating surface that partially constitutes the RFCPU 711.

The reset circuit 717 generates a signal that resets the digital circuit portion 713 to be initialized. For example, the reset circuit 717 generates, as a reset signal, a signal that rises with delay after increase in the power supply voltage. The oscillation circuit 718 changes the frequency and the duty ratio of a clock signal in accordance with a control signal generated by the constant voltage circuit 716. The demodulation circuit 719 having a low pass filter, for example, binarizes changes in amplitude of reception signals of an amplitude shift keying (ASK) system. The modulation circuit 720 changes the amplitude of transmission signals of an amplitude shift keying (ASK) system to be transmitted. The modulation circuit 720 changes the resonance point of the resonance circuit 714, thereby changing the amplitude of communication signals. The clock controller 723 generates a control signal for changing the frequency and the duty ratio of the clock signal in accordance with a power supply voltage or current consumption in the central processing unit 725. The power supply voltage is monitored by a power supply control circuit 730.

A signal that is inputted to the RFCPU 711 from the antenna 728 is demodulated by the demodulation circuit 719, and then divided into a control command, data, and the like by the RF interface 721. The control command is stored in the control register 722. The control command includes, reading of data stored in the read only memory 727, writing of data to the random access memory 726, an arithmetic instruction to the central processing unit 725, and the like. The central processing unit 725 accesses the read only memory 727, the random access memory 726, and the control register 722 via the CPU interface 724. The CPU interface 724 has a function of generating an access signal for any one of the read only memory 727, the random access memory 726, and the control register 722 based on an address requested by the central processing unit 725.

As an arithmetic method of the central processing unit 725, a method may be employed in which the read only memory 727 stores an OS (operating system) and a reading program is executed at the time of starting operation. Alternatively, a method may be employed in which an arithmetic circuit using a dedicated circuit conducts an arithmetic process as hardware. In a method in which both hardware and software are used, a method can be used in which a part of process is conducted in a dedicated arithmetic circuit and the other part of process is conducted by the central processing unit 725 using a program.

The RFCPU 711 can achieve not only increase in processing speed but also reduction in power consumption because an integrated circuit is formed using a single crystal semiconductor layer with uniform crystal orientation which is bonded to a substrate having an insulating surface or an insulating substrate. This makes it possible to ensure the operation for a long period of time even when the capacitor portion 729 which supplies power is downsized. Although FIG. 7 shows the mode of the RFCPU, a device such as an IC tag is also possible as long as it has a communication function, an arithmetic processing function, and a memory function.

In the RFCPU described in Embodiment Mode 3, the integrated circuit is formed of a semiconductor film in which the first semiconductor film added with an impurity (an n-type impurity or a p-type impurity) having a conductivity type opposite to that of the source and the drain regions and the second semiconductor film formed of the single crystal semiconductor with uniform crystal orientation are stacked. Therefore, the RFCPU of the invention can achieve not only improvement in switching characteristics by suppressing a punch-through current which flows through the bottom portion of the channel formation region, but also increase in processing speed and reduction in power consumption.

Note that the structure shown in Embodiment mode 3 can be freely combined with the structure shown in Embodiment Mode 1 or 2.

Embodiment Mode 4

In Embodiment Mode 4, description is made of a case where a large-sized substrate called a mother glass substrate which is used to manufacture a display panel is used as a substrate over which a semiconductor device of the present invention is formed as shown in Embodiment Mode 1.

Figure 8A:
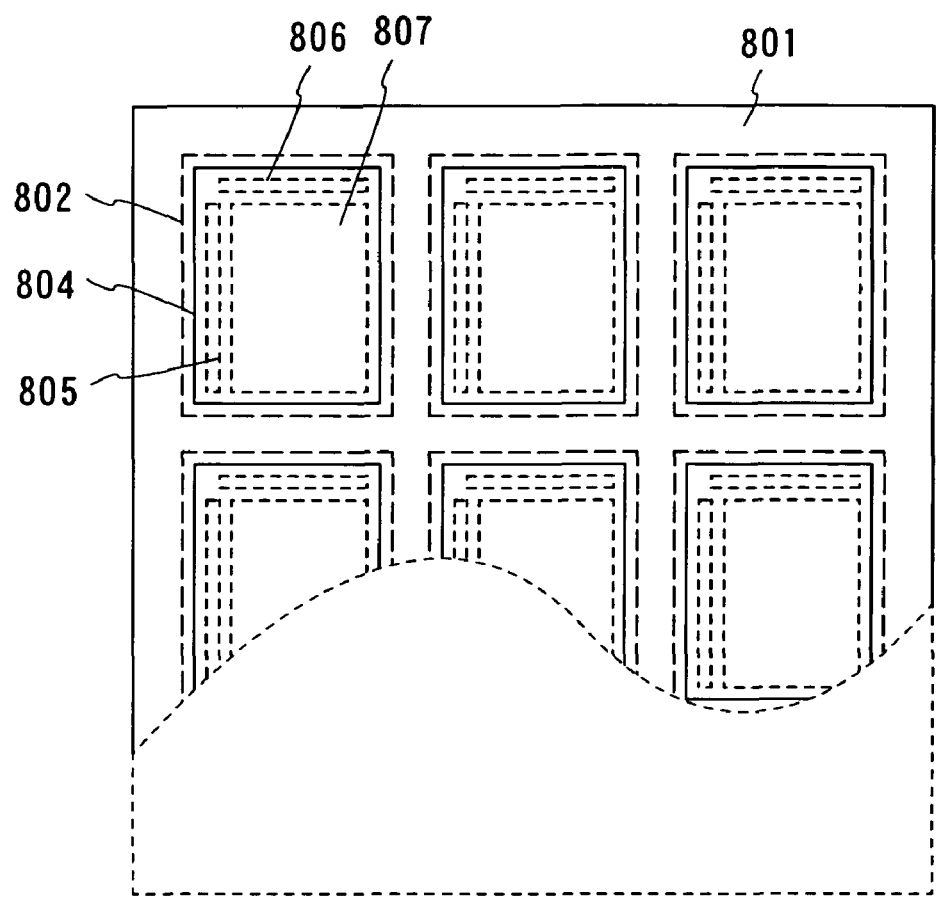
FIGS. 8A and 8B are views illustrating a case where a single crystal semiconductor film is bonded to a large size substrate in the present invention.
Figure 8B:
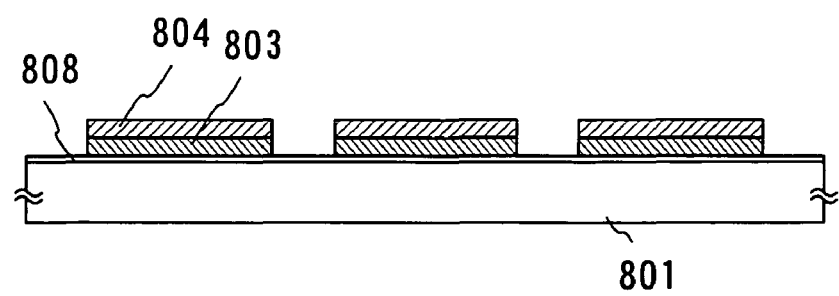

As shown in FIGS. 8A and 8B, a plurality of display panels 802 are formed over a mother glass that is a substrate 801. The plurality of the display panels 802 are taken out from the mother glass, and a second semiconductor film 804 that is a single crystal semiconductor formed by bonding of a semiconductor substrate is preferably bonded to a first semiconductor film 803 including an n-type or a p-type impurity over the substrate 801 to match a formation region of the display panels 802. Since a mother glass substrate has a larger area than a semiconductor substrate, it is preferable that the second semiconductor film 804 be arranged within the formation regions of each display panel 802, as shown in FIG. 8A. Accordingly, even if the plurality of the second semiconductor films 804 are arranged over the substrate 801, a sufficient space can be provided between adjacent second semiconductor films 804.

Each of the display panels 802 includes a scan line driver circuit region 805, a signal line driver circuit region 806, and a pixel formation region 807. The second semiconductor film 804 is bonded to the substrate 801 so that the display panel 802 can include these regions.

FIG. 8B is a cross sectional view of FIG. 8A. There is a possibility that the semiconductor film formed over the substrate 801 is contaminated by diffusion of impurities such as sodium from the substrate 801 that is a large size glass substrate; therefore, an insulating film 808 functioning as a barrier film is preferably formed over the substrate 801 as shown in FIG. 8B.

Figure 9A:
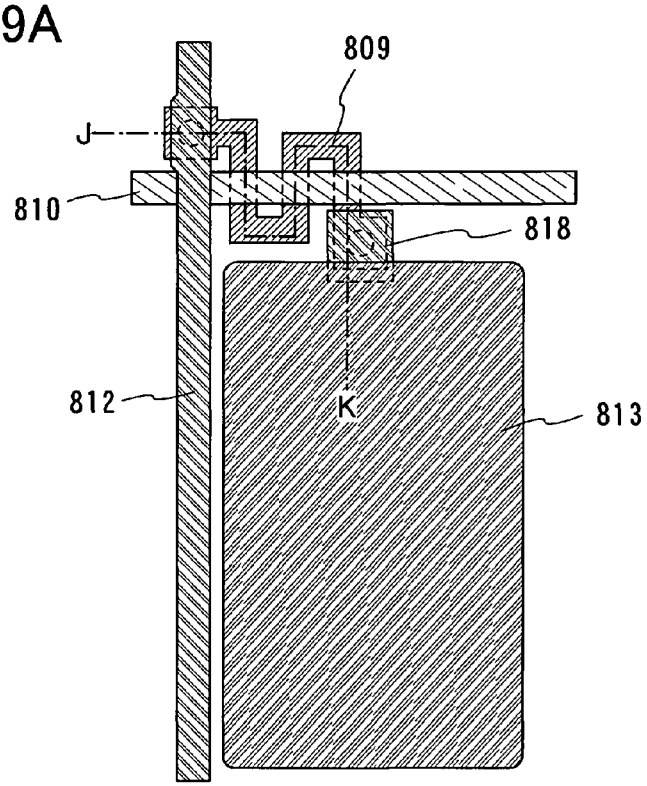
FIGS. 9A and 9B are views illustrating one example of a liquid crystal display device in the present invention.
Figure 9B:
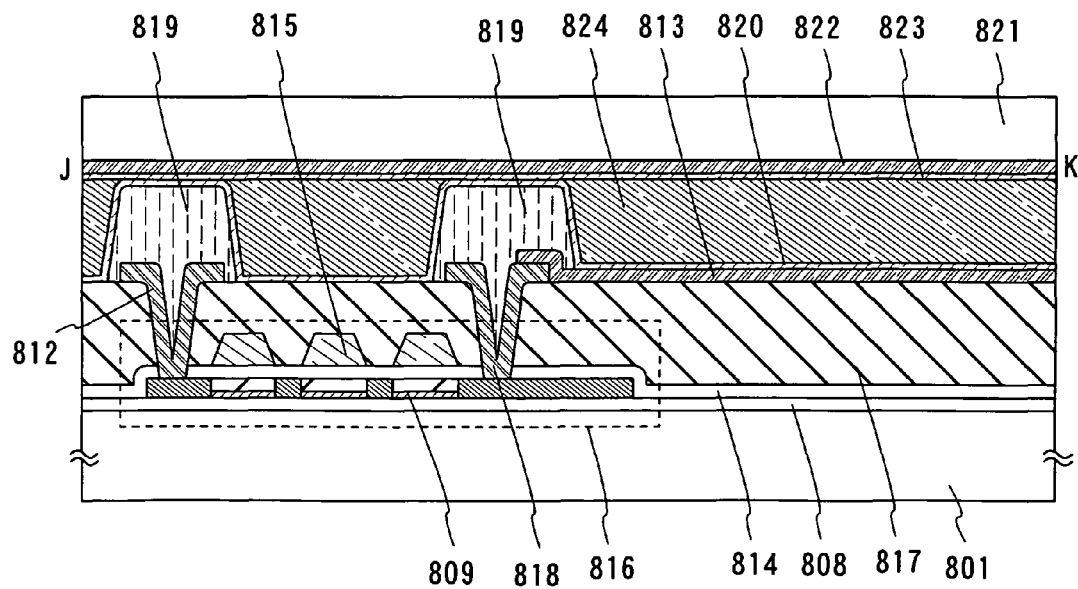

In this embodiment mode, in addition to the SOI substrate shown in FIGS. 8A and 8B, as an example of a display device manufactured using such an SOI substrate, description is made on a liquid crystal display device with reference to FIGS. 9A and 9B. FIG. 9A is a plane view of a pixel of the liquid crystal display device, in which a scan line 810 intersects with a semiconductor film 809 having a stacked structure formed by bonding a single crystal semiconductor film to a semiconductor film including an n-type or a p-type impurity, and a signal line 812 and a pixel electrode 813 are connected to the semiconductor film 809. FIG. 9B is a cross sectional view taken along a line J-K in FIG. 9A.

In FIG. 9B, there is a portion in which the insulating film 808, the semiconductor film 809 having a stacked structure of a semiconductor film including an n-type or a p-type impurity and the single crystal semiconductor film, a gate insulating film 814, and a gate electrode 815 are stacked over the substrate 801, and a pixel transistor 816 is formed to include such a portion.

Further, the signal line 812, the pixel electrode 813, and an electrode 818 are provided over an interlayer insulating film 817. Columnar spacers 819 are formed over the interlayer insulating film 817, and an orientation film 820 is formed to cover the signal line 812, the pixel electrode 813, the electrode 818, and the columnar spacers 819. A counter substrate 821 is provided with a counter electrode 822 and an orientation film 823 which covers the counter electrode. The columnar spacers 819 are formed to keep a gap between the substrate 101 and the counter substrate 821. A liquid crystal layer 824 is formed in spaces formed by the columnar spacers 819. At portions where the semiconductor film 809 is connected to the signal line 812 and the electrode 818, steps are generated in the interlayer insulating film 817 by formation of the contact holes. The columnar spacers 819 are provided so as to fill the steps. Accordingly, disorder in the orientation of liquid crystal can be prevented.

Figure 10A:
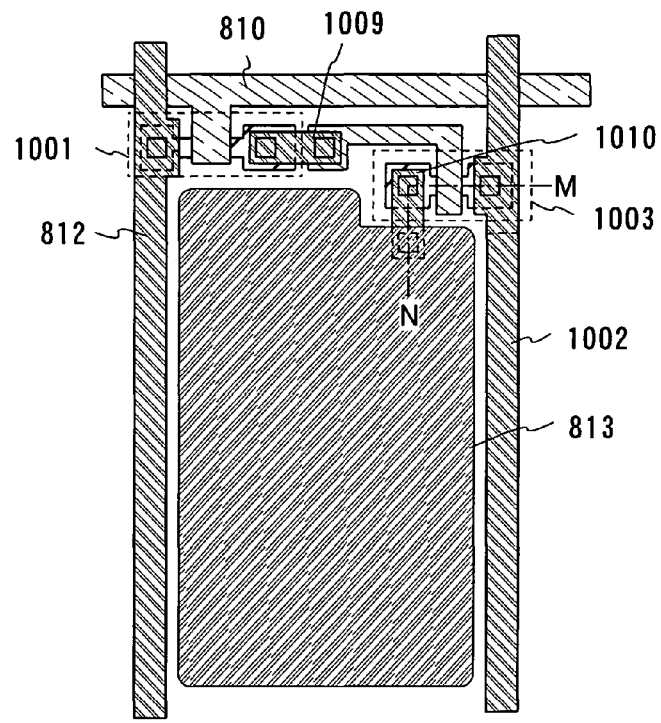
FIGS. 10A and 10B are views illustrating one example of an electroluminescence display device in the present invention.
Figure 10B:
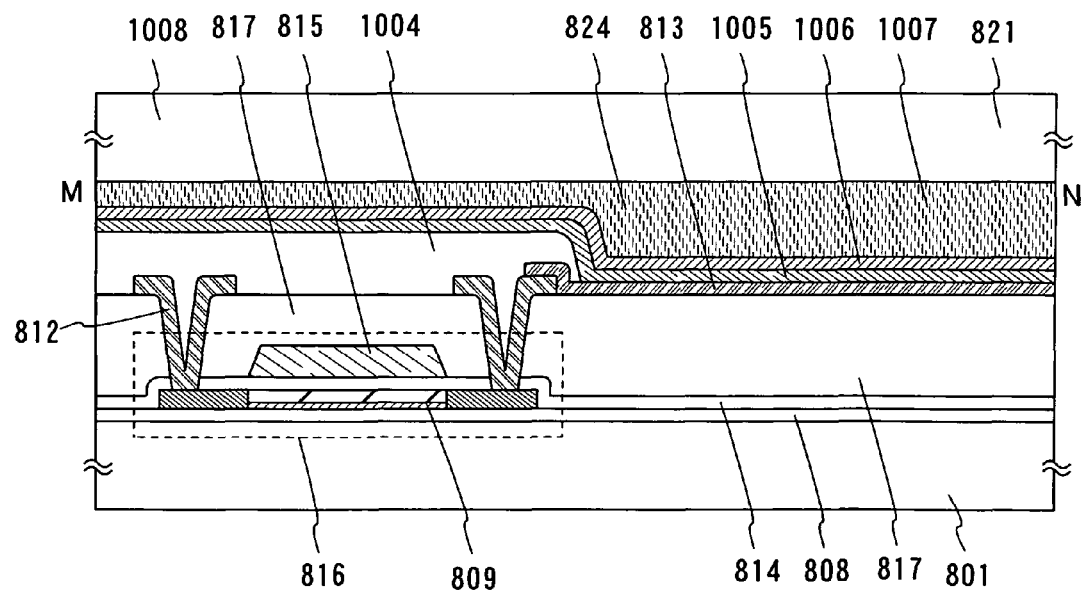

Next, an electroluminescent display device (hereinafter also referred to as an EL display device) will be described with reference to FIGS. 10A and 10B in addition to the liquid crystal display device shown in FIGS. 9A and 9B. FIG. 10A is a plane view of a pixel of the EL display device and includes a selection transistor 1001 which connects to the signal line 812 and a display control transistor 1003 which connects to a current supply line 1002. This display device has a structure in which each pixel of the display device is provided with a light emitting element that has a layer (EL layer) formed to contain an electroluminescent material between a pair of electrodes. One electrode of the light emitting element is the pixel electrode 813, which is connected to the display control transistor 1003. FIG. 10B is a cross-sectional view showing a main portion of such a pixel.

In FIG. 10B, over the substrate 801, there is a portion where the insulating film 808; the semiconductor film 809 having a stacked structure of a semiconductor film including an n-type or a p-type impurity and a single crystal semiconductor film; the gate insulating film 814; and the gate electrode 815 are stacked. The selection transistor 1001 and the display control transistor 1003 are formed to have such a portion.

Further, the interlayer insulating film 817 is formed to cover the gate electrode 815 of the display control transistor 1003. The signal line 812, the current supply line 1002, electrodes 1009 and 1010, and the like are formed over the interlayer insulating film 817. Furthermore, the pixel electrode 813 which is electrically connected to the electrode 1010 is formed over the interlayer insulating film 817. A peripheral portion of the pixel electrode 813 is surrounded by an insulating partition layer 1004. An EL layer 1005 is formed over the pixel electrode 813. A counter electrode 1006 is formed over the EL layer 1005. A pixel portion is filled with a filling resin 1007, and the counter substrate 1008 is provided as a reinforcing plate.

The above-described display device (liquid crystal display device, electroluminescence display device) is formed to include a semiconductor element having a channel formation region formed of a semiconductor film in which a first semiconductor film added with an impurity (an n-type impurity or a p-type impurity) having a conductivity type opposite to that of the source region and the drain region and a second semiconductor film that is a single crystal semiconductor are stacked, and the first semiconductor film is provided for the back channel side (the side opposite to the gate electrode) of the channel formation region of the first semiconductor film. Therefore, a punch-through current which flows through the bottom portion of the channel formation region in the transistor can be suppressed, and switching characteristics can be improved and reliability can be enhanced. As a result, high quality display can be achieved.

Note that the structure shown in Embodiment mode 4 can be freely combined with any of the structures shown in Embodiment Mode 1 to 3.

Embodiment Mode 5

In this embodiment mode, various electronic appliances manufactured using the present invention is described with reference to FIGS. 1A to 1F. Examples of the electronic appliances include: television devices (also referred to as simply, televisions or television receivers), cameras such as video cameras or digital cameras, goggle displays (head mounted displays), navigation systems, audio reproducing devices (e.g., car audio component stereos and audio component stereos), laptop personal computers, game machines, portable information terminals (e.g., mobile computers, mobile phones, portable game machines, and electronic books), image reproducing devices provided with recording media (specifically, devices that can reproduce a recording medium such as a digital versatile disc (DVD) and are provided with a display device capable of displaying the reproduced images), and the like. Preferred modes thereof will be explained with reference to FIGS. 11A to 11F.

Figure 11A:
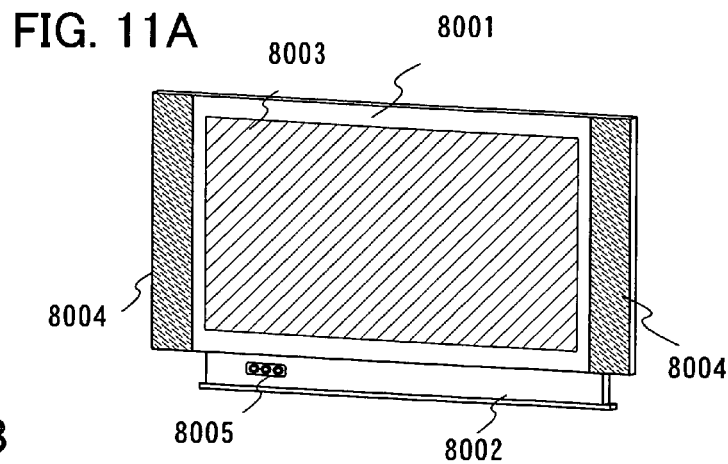
FIGS. 11A to 11F are views illustrating examples of electronic appliances in the present invention.

FIG. 11A shows a display device, which includes a chassis 8001, a support stand 8002, a display 8003, speakers 8004, video input terminals 8005, and the like. The liquid crystal display device described in FIGS. 9A and 9B or the light emitting device described in FIGS. 10A and 10B can be used in the display 8003, and an image with high image quality can be displayed. It is to be noted that the display device includes all devices for displaying information, for example, for a personal computer, for receiving TV broadcasting, and for displaying an advertisement.

Figure 11B:
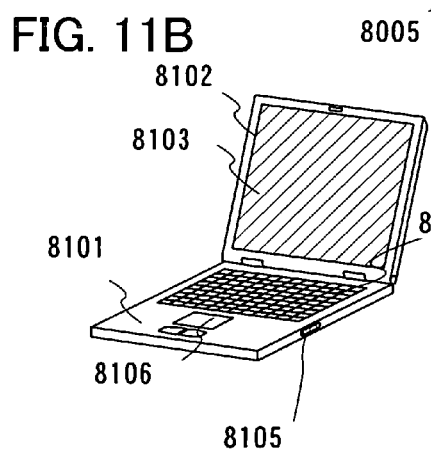

FIG. 11B shows a laptop personal computer, which includes a main body 8101, a chassis 8102, a display 8103, a keyboard 8104, an external connection port 8105, a mouse 8106, and the like. The liquid crystal display device described in FIGS. 9A and 9B or the light emitting device described in FIGS. 10A and 10B can be used in the display 8003, and thus an image with high image quality can be displayed.

Figure 11C:
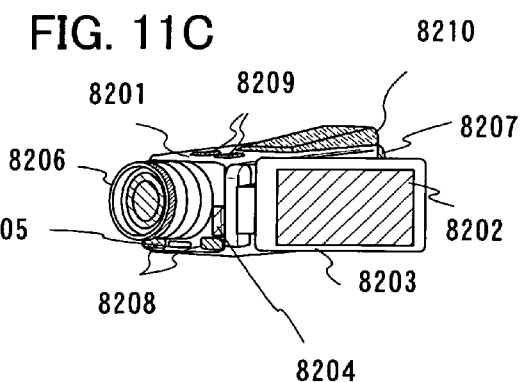

FIG. 11C shows a video camera, which includes a main body 8201, a display 8202, a chassis 8203, an external connection port 8204, a remote control receiving portion 8205, an image receiving portion 8206, a battery 8207, an audio input portion 8208, operation keys 8209, an eyepiece portion 8210, and the like. The liquid crystal display device described in FIGS. 9A and 9B or the light emitting device described in FIGS. 10A and 10B can be used in the display 8202, and an image with high image quality can be displayed.

Figure 11D:
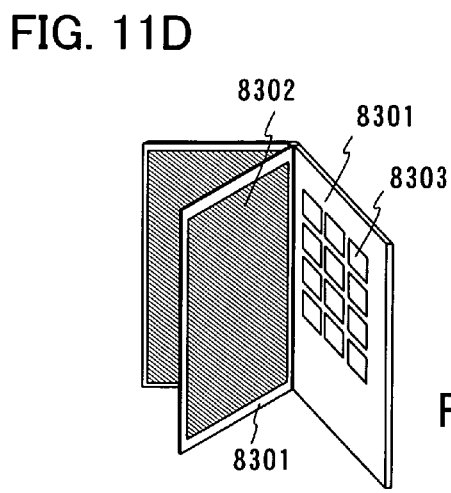

FIG. 11D shows an electronic book, which includes a main body 8301, a display 8302, an operation key 8303, and the like. A modem may be built in, or a structure in which information can be transmitted and received wirelessly may be employed. In a memory portion of the electronic book, a NOR-type nonvolatile memory with a memory capacity of 20 gigabytes (GB) to 200 gigabytes (GB) can be used, with which images or sounds (music) can be stored and reproduced. The microprocessor 600 described in FIG. 6 or the RFCPU described in FIG. 7 can be used in the memory portion which stores information of the electronic book and a microprocessor which operates the electronic book. Further, the liquid crystal display device described in FIGS. 9A and 9B or the light emitting device described in FIGS. 10A and 10B can be used in the display 8302, and an image with high image quality can be displayed.

Figure 11E:
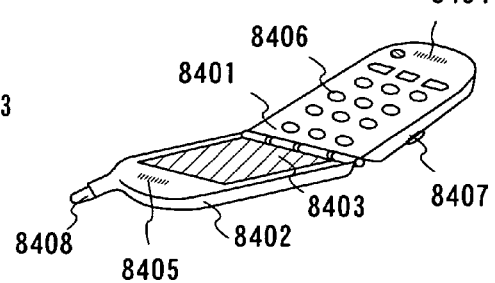

FIG. 11E shows a mobile phone, which includes a main body 8401, a chassis 8402, a display 8403, an audio input portion 8404, an audio output portion 8405, operation keys 8406, an external connection port 8407, an antenna 8408, and the like. The liquid crystal display device described in FIGS. 9A and 9B or the light emitting device described in FIGS. 10A and 10B can be used in the display 8403, and an image with high image quality can be displayed.

Figure 11F:
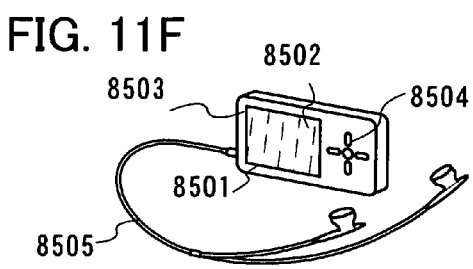

FIG. 11F is a digital player, which is a typical example of an audio device. The digital player has a main body 8501, a display 8502, a chassis 8503, operation switches 8504, earphones 8505, and the like. Headphones or wireless earphones can be used instead of the earphones 8505. In the digital player, the microprocessor described in FIG. 6 or the RFCPU described in FIG. 7, and the like can be used in a memory portion which stores music information or a microprocessor which operates the digital player. The digital player can achieve reductions in size and weight. By application of the liquid crystal display device described in FIGS. 9A and 9B or the light emitting device described in FIGS. 10A and 10B to the display 8502, display with high image quality can be achieved even if a screen size is from about 0.3 inches to 2 inches.

The electronic appliances shown in Embodiment Mode 5 can be implemented by being freely combined with the structure shown in Embodiment Modes 1 to 4.

This application is based on Japanese Patent Application serial no. 2007-187970 filed with Japan Patent Office on Jul. 19, 2007, the entire contents of which are hereby incorporated by reference.

What is claimed is:

1. A method for manufacturing a semiconductor device comprising the steps of:
   forming a first semiconductor film over a substrate having an insulating surface;
   implanting a first conductivity type impurity into the first semiconductor film;
   forming an ion separation layer in a region of a predetermined depth below a surface of a single crystal semiconductor substrate by irradiating the single crystal semiconductor substrate with at least one kind of ions generated by plasma excitation of a source gas selected from the group consisting of hydrogen, helium, and halogen, wherein the ions are constituted by the same element;

after implanting the first conductivity type impurity, bonding the surface of the single crystal semiconductor substrate to the surface of the first semiconductor film;

generating a crack in the ion separation layer by heating the bonded single crystal semiconductor substrate and the first semiconductor film; and forming a second semiconductor film by separating the single crystal semiconductor substrate at the crack in the ion separation layer with the second semiconductor film left on the first semiconductor film.

2. A method for manufacturing a semiconductor device according to claim 1, wherein the heating is performed at a temperature at which the ions contained in the ion separation layer are released from the ion separation layer.

3. A method for manufacturing a semiconductor device according to claim 1, wherein the heating is performed at from 400° C. to 600° C.

4. A method for manufacturing a semiconductor device according to claim 1, further comprising the step of:
forming an insulating film between the substrate and the first semiconductor film.

5. A method for manufacturing a semiconductor device according to claim 1, further comprising the step of:
forming a gate electrode over the second semiconductor film.

6. A method for manufacturing a semiconductor device according to claim 5, further comprising the steps of:
forming sidewall insulating layers on either side of the gate electrode; and
forming lightly doped regions under the sidewall insulating layers in the first semiconductor film and the second semiconductor film.

7. A method for manufacturing a semiconductor device according to claim 1, wherein the substrate is a glass substrate.

8. A method for manufacturing a semiconductor device according to claim 1, wherein the first semiconductor film is formed by a method selected from the group consisting of a sputtering method, a plasma CVD method and a low-pressure CVD method.

9. A method for manufacturing a semiconductor device according to claim 1, wherein the ion separation layer is formed by irradiating the single crystal semiconductor substrate with only one kind of ions of the element.

10. A method for manufacturing a semiconductor device according to claim 1, wherein the ion separation layer is formed by irradiating the single crystal semiconductor substrate with two or more kind of ions of the element.

11. A method for manufacturing a semiconductor device comprising the steps of:
forming a first semiconductor film over a substrate having an insulating surface;
implanting a first conductivity type impurity into a first portion of the first semiconductor film;
implanting a second conductivity type impurity into a second portion of the first semiconductor film, wherein the second conductivity type impurity is opposite to a conductivity type of the first conductivity type impurity;
forming an ion separation layer in a region of a predetermined depth below a surface of a single crystal semiconductor substrate by irradiating the single crystal semiconductor substrate with at least one kind of ions generated by plasma excitation of a source gas selected from the group consisting of hydrogen, helium, and halogen, wherein the ions are constituted by the same element;

after implanting the first conductivity type impurity, bonding the surface of the single crystal semiconductor substrate to the surface of the first portion and the second portion of the first semiconductor film;

generating a crack in the ion separation layer by heating the bonded single crystal semiconductor substrate and the first portion and the second portion of the first semiconductor film; and forming a second semiconductor film by separating the single crystal semiconductor substrate at the crack in the ion separation layer with the second semiconductor film left on the first portion and the second portion of the first semiconductor film.

12. A method for manufacturing a semiconductor device according to claim 11, wherein the heating is performed at a temperature at which the ions contained in the ion separation layer are released from the ion separation layer.

13. A method for manufacturing a semiconductor device according to claim 11, wherein the heating is performed at from 400° C. to 600° C.

14. A method for manufacturing a semiconductor device according to claim 11, further comprising the step of:
forming an insulating film between the substrate and the first semiconductor film.

15. A method for manufacturing a semiconductor device according to claim 11, further comprising the step of:
forming a gate electrode over the second semiconductor film.

16. A method for manufacturing a semiconductor device according to claim 15, further comprising the steps of:
forming sidewall insulating layers on either side of the gate electrode; and
forming lightly doped regions under the sidewall insulating layers in the first semiconductor film and the second semiconductor film.

17. A method for manufacturing a semiconductor device according to claim 11, wherein the substrate is a glass substrate.

18. A method for manufacturing a semiconductor device according to claim 11, wherein the first semiconductor film is formed by a method selected from the group consisting of a sputtering method, a plasma CVD method and a low-pressure CVD method.

19. A method for manufacturing a semiconductor device according to claim 11, wherein the ion separation layer is formed by irradiating the single crystal semiconductor substrate with only one kind of ions of the element.

20. A method for manufacturing a semiconductor device according to claim 11, wherein the ion separation layer is formed by irradiating the single crystal semiconductor substrate with two or more kind of ions of the element.

21. A method for manufacturing a semiconductor device according to claim 1, further comprising:
implanting a second conductivity type impurity into the first semiconductor film and the second semiconductor film, so as to form a source region and a drain region, wherein the second conductivity type impurity is opposite to a conductivity type of the first conductivity type impurity.

* * * * *